(12) United States Patent
Lamb, III et al.

(10) Patent No.: US 6,391,472 B1
(45) Date of Patent: May 21, 2002

(54) FILL MATERIAL FOR DUAL DAMASCENE PROCESSES

(75) Inventors: James E. Lamb, III; Xie Shao, both of Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 0 days.

(21) Appl. No.: 09/931,264

(22) Filed: Aug. 16, 2001

Related U.S. Application Data

(60) Continuation of application No. 09/440,399, filed on Nov. 15, 1999, now abandoned, which is a division of application No. 09/383,785, filed on Aug. 26, 1999, now abandoned.

(51) Int. Cl.$^7$ .............................................. B21D 39/00
(52) U.S. Cl. ........................................................ 428/624
(58) Field of Search ........................ 438/621; 428/175, 428/624

(56) References Cited

U.S. PATENT DOCUMENTS

| | | |
|---|---|---|
| 4,451,597 A | 5/1984 | Victorius |
| 4,665,007 A | 5/1987 | Cservak et al. |
| 4,727,100 A | 2/1988 | Vasta |
| 4,834,799 A | 5/1989 | Song |
| 4,981,891 A | 1/1991 | Felter et al. |
| 5,283,104 A | 2/1994 | Aoude et al. |
| 5,595,937 A | 1/1997 | Mikagi |
| 5,602,198 A | 2/1997 | Das et al. |
| 5,859,136 A | 1/1999 | Scopazzi et al. |
| 5,877,075 A | 3/1999 | Dai et al. |
| 5,882,996 A | 3/1999 | Dai |
| 5,886,411 A | 3/1999 | Kohyama |
| 5,891,799 A | 4/1999 | Tsui |
| 5,962,195 A | 10/1999 | Yen et al. |
| 5,989,623 A | 11/1999 | Chen et al. |
| 6,010,956 A | 1/2000 | Takiguchi et al. |
| 6,059,553 A * | 5/2000 | Jin et al. .............. 252/62.3 BT |
| 6,100,190 A | 8/2000 | Kobori |
| 6,103,456 A | 8/2000 | Többen et al. |
| 6,117,781 A | 9/2000 | Lukane et al. |
| 6,140,226 A | 10/2000 | Grill et al. |
| 6,165,899 A | 12/2000 | Matumoto |
| 6,204,166 B1 | 3/2001 | McTeer |
| 6,265,303 B1 * | 7/2001 | Lu et al. ..................... 438/623 |

* cited by examiner

Primary Examiner—Deborah Jones
Assistant Examiner—Gwendolyn Blackwell-Rudasill
(74) Attorney, Agent, or Firm—Hovey Williams LLP

(57) ABSTRACT

An improved via and contact hole fill composition and method for using the composition in the dual damascene production of circuits is provided. Broadly, the fill compositions include a quantity of solid components including a polymer binder and a solvent system for the solid components. The boiling point of the solvent system is less than the cross-linking temperature of the composition. Preferred solvents for use in the solvent system include those selected from the group consisting of alcohols, ethers, glycol ethers, amides, ketones, and mixtures thereof. Preferred polymer binders are those having an aliphatic backbone and a molecular weight of less than about 80,000, with polyesters being particularly preferred. In use, the fill composition is applied to the substrate surfaces forming the contact or via holes as well as to the substrate surfaces surrounding the holes, followed by heating to the composition reflow temperature so as to cause the composition to uniformly flow into and cover the hole-forming surfaces and substrate surfaces. The composition is then cured, and the remainder of the dual damascene process is carried out.

11 Claims, 10 Drawing Sheets

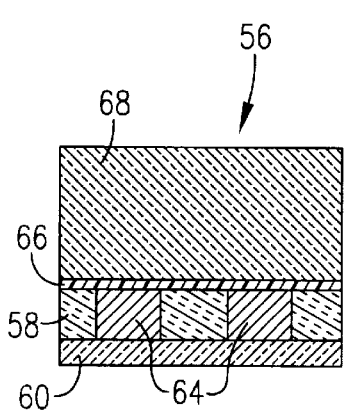
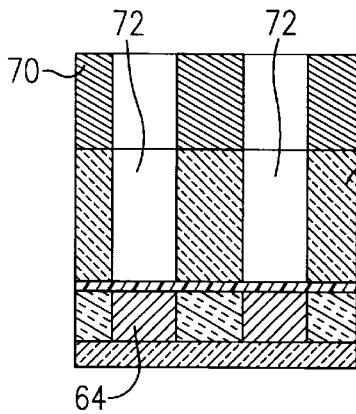
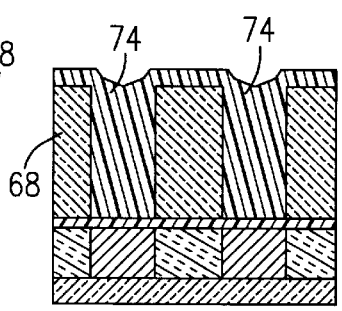
*FIG. 4A.*  *FIG. 4B.*  *FIG. 4C.*
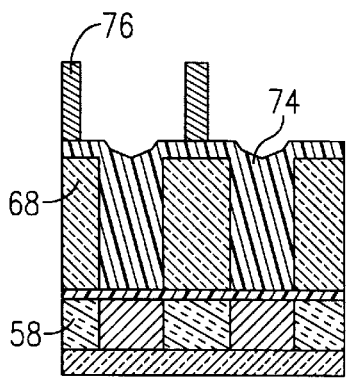
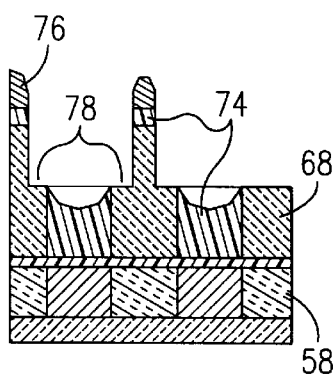
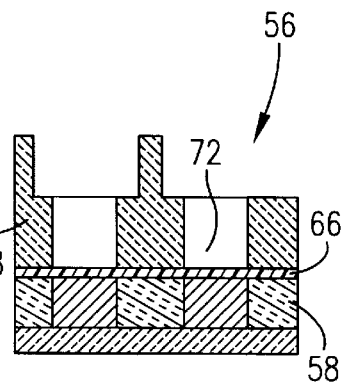
*FIG. 4D.*  *FIG. 4E.*  *FIG. 4F.*
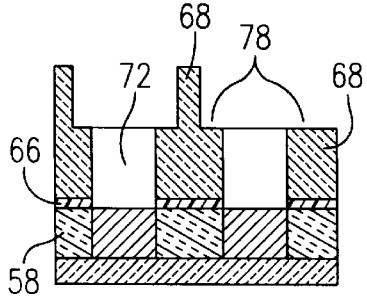
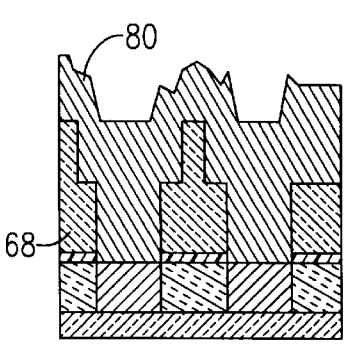
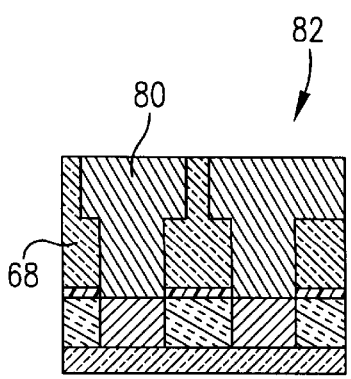
*FIG. 4G.*  *FIG. 4H.*  *FIG. 4I.*

FILL MATERIAL FOR DUAL DAMASCENE PROCESSES

RELATED APPLICATION

This application is a continuation of U.S. patent application Ser. No. 09/440,399 filed Nov. 15, 1999, now abandoned; which is a divisional of U.S. patent application Ser. No. 09/383,785 filed Aug. 26, 1999, now abandoned.

BACKGROUND OF THE INVENTION

1. Field of the Invention

The present invention is broadly concerned with fill compositions and methods useful for protecting the surfaces forming the contact and via holes during dual damascene processes for the production of integrated circuits. More particularly, the compositions of the invention comprise a quantity of solid cross-linkable components including a polymer binder, and a solvent system for the solid components. The boiling point of the solvent system is preferably sufficiently lower than the cross-linking temperature of the composition so that essentially all of the solvent system is evaporated during the first stage bake without the fill composition being cross-linked to any appreciable degree. In use, the fill compositions are applied to a substrate previously patterned with contact or via hole according to conventional methods followed by heating the composition to its reflow temperature in order to evaporate the solvent system and cause the composition to flow into the hole for uniform coverage. The composition is then cured and the remainder of the dual damascene process carried out in the usual fashion.

2. Description of the Prior Art

The damascene process, or the process of forming inlaid metal patterning in preformed grooves, is generally a preferred method of fabricating interconnections for integrated circuits. In its simplest form, the dual damascene process starts with an insulating layer which is first formed on a substrate and then planarized. Horizontal trenches and vertical holes (i.e., the contact and via holes) are then etched into the insulating layer corresponding to the required metal line pattern and hole locations, respectively, that will descend down through the insulating layer to the device regions (if through the first insulating layer, i.e., a contact hole) or to the next metal layer down (if through an upper insulating layer in the substrate structure, i.e., a via hole). Metal is next deposited over the substrate thereby filling the trenches and the holes, and thus forming the metal lines and the interconnect holes simultaneously. As a final step, the resulting surface is planarized using the known chemical-mechanical polish (CMP) technique, and readied to accept another dual damascene structure.

During the dual damascene process, the contact and via holes are typically etched to completion prior to the trench etching. Thus, the step of trench etching exposes the bottom and sidewalls (which are formed of the insulating or dielectric layer) of the contact or via holes to over-etch which can deteriorate the contact with the base layer. An organic material is therefore used to partially or completely fill the via or contact holes and to protect the bottom and sidewalls from further etch attack. These organic fill materials can also serve as a bottom anti-reflective coating (BARC) to reduce or eliminate pattern degradation and linewidth variation in the patterning of the trench layer, provided the fill material covers the surface of the dielectric layer.

Fill materials have been used for the past several years which have high optical density at the typical exposure wavelengths. However, these prior art materials have limited fill properties. For example, when the prior art compositions are applied to the via or contact holes formed within the substrate and to the substrate surface, the films formed by the compositions tend to be quite thin on the substrate surface immediately adjacent the holes, thus leading to undesirable light reflection during subsequent exposure steps. Also, because the prior art compositions etch more slowly than the dielectric layer, the unetched fill compositions provide a wall on which the etch polymer will deposit. This etch polymer build-up then creates undesirable resistance within the metal interconnects of the final circuit. These problems are explained in more detail below.

There is a need in the art for contact or via hole fill materials which provide complete coverage at the top of via and contact holes. Furthermore, this material should provide adequate protection to the base of the via and contact holes during etching to prevent degradation of the barrier layer and damage to the underlying metal conductors. In order to prevent sidewall polymer buildup, the etch rate of the material should be equal to or greater than the etch rate of the dielectric material, or the contact or via holes should be filled partially so that the fill material in the holes does not extend above the base of the trench following trench etch.

SUMMARY OF THE INVENTION

The instant invention overcomes the problems in the art by providing a fill material or composition which can be applied to via and/or contact holes during damascene processing to provide complete surface coverage while avoiding undue buildup of the etch polymer around the top edge of the holes at the base of the trench of the damascene structure.

In more detail, the compositions (fill material and fill composition are used interchangeably herein) of the invention comprise a quantity of solid components including a polymer binder or resin, and a solvent system (either single or multiple solvents) for the solid components. The inventive compositions are superior to prior art compositions in that they are formulated to achieve two requirements: the inventive composition will freely and evenly flow into the contact or via holes with minimal or no cross-linking of the composition during the pre-bake stage (i.e., first stage bake); and during the pre-bake stage essentially all of the solvent is evaporated so that the composition incurs very little shrinkage during the final bake stage. These two requirements are quantified by subjecting the composition to the "pre-bake thermal stability test" and the "film shrinkage test" set forth in detail below.

There are numerous factors which affect the ability of the fill composition to meet the foregoing requirements. For example, the polymer binder or resin preferably comprises an aliphatic backbone and has a molecular weight of less than about 80,000, preferably less than about 25,000, and more preferably from about 2000–7500. Suitable polymer binders include polyesters, polyacrylates, polyheterocyclics, polyetherketones, polyhydroxystyrene, polycarbonates, polyepichlorohydrin, polyvinyl alcohol, oligomeric resins (such as crown ethers, cyclodextrins, epoxy resins), and mixtures of the foregoing. The solvent systems utilized in the composition of the invention preferably have a boiling point of less than about 160° C., more preferably less than about 140° C., and most preferably less than about 120° C. The solvent system should also have a flash point of greater than about 85° C., and more preferably greater than about 100° C. When more than one solvent is utilized in the solvent system, the boiling point or flash point of the solvent system refers to the boiling point or flash point of the highest boiling or lowest flashing solvent. It is also important that the solvent system be compatible with the resist system chosen for the particular damascene process. That is to say, an air-dried film of the fill composition should redissolve in the chosen resist solvent system within 30 seconds with essentially no undissolved residue being visible in the solution.

The concentrations of the solvent system and other volatile species present in the composition is not critical, so long as the total concentration of the solvent system and volatile species in the film just prior to cross-linking of the film (i.e., just prior to the second stage bake) is less than about 5% by weight, and preferably less than about 2% by weight, based upon the total weight of the fill composition taken as 100% by weight. This solvent system and volatile weight percent in combination with the above solvent system boiling and flash points is important to ensure that minimal shrinking of the composition occurs during the second stage bake. Preferred solvents for use in the solvent system include alcohols, ethers, glycol ethers, amides, esters, ketones, water, propylene glycol monomethyl ether (PGME), propylene glycol monomethyl ether acetate (PGMEA), ethyl lactate, and PCBTF (p-chlorobenzotrifluoride), with PGME being particularly preferred.

The fill compositions of the inventions preferably cross-link at a temperature of from about 150–220° C., and more preferably about 180° C. It is important that the fill compositions cross-link at a temperature higher than the temperature to which the composition is heated during the first stage reflow baking so as to avoid undue cross-linking of the composition during the reflow step. Such premature cross-linking would prevent the composition from completely and uniformly flowing into the contact or via holes. Cross-linking of the polymer binder in the composition can be accomplished by the use of a cross-linking agent in the composition or by the selection of polymer binders which include "built in" cross-linking moieties. Preferred cross-linking systems include acid or base catalyzed, thermal catalyzed, and photocatalyzed systems such as aminoplasts, epoxides, blocked isocyanates, acrylics, and mixtures thereof.

All solid components utilized in the fill compositions of the invention should form a free-flowing liquid at a first stage reflow bake temperature of less than about 200° C., and preferably less than about 120° C., thus preventing the composition from adhering to the hole sidewalls and forming a steep meniscus. All components must remain chemically stable at these reflow temperatures for at least about 15 seconds, and preferably at least about 30 seconds. By chemically stable, it is meant that the components only undergo changes in their physical state and not in their chemical state (such as by cross-linking of their components). The chemical stability can be determined by UV/VIS or FTIR analysis, both before and after the first stage bake.

In order to avoid the etch polymer buildup problems of the prior art, the etch rate of the fill composition should be approximately equal to the base material or dielectric material etch rate. Furthermore, the fill composition should have a faster etch rate than the etch rate of the photoresist. The ratio of the composition etch rate to the photoresist etch rate should be at least about 1.5:1, preferably at least about 3:1, and more preferably at least about 4:1. One way to achieve such fill composition etch rates is through the selection of the polymer binder. Highly oxygenated or halogenated species will result in an increased etch rate.

The compositions can also be formulated to include optional ingredients as necessary. Optional ingredients include wetting agents (such as fluorinated surfactants, ionic surfactants, non-ionic surfactants, and surface active polymer additives) and dyes or chromophores. Examples of suitable dyes include any compound that absorbs at the electromagnetic wavelength used for the particular process. Examples of dyes which can be used include compounds containing anthracene, naphthalene, benzene, chalcone, phthalimides, pamoic acid, acridine, azo compounds, and dibenzofuran. The dyes may be physically mixed into the composition, or alternately, may be chemically bonded to the polymer binder. For e-beam exposure, conductive compounds can be used.

The method of applying the fill compositions to a substrate with a contact or via hole simply comprises applying a quantity of a composition hereof to the substrate surfaces forming the hole by any conventional application method (including spin coating). After the composition is applied to the hole, it should be heated to its reflow temperature (as set forth above) during the first stage bake so as to cause the composition to flow into the contact or via hole(s), thus achieving the desired hole and substrate surface coverage. After the desired coverage is achieved, the resulting fill composition film should then be heated to at least the cross-linking temperature of the composition so as to cure the film.

In partial fill processes, the height of the cured fill material in the hole should be from about 35–65%, and preferably at least about 50% of the depth of the hole. In complete fill processes, the height of the cured fill material in the hole should be at least about 95%, and preferably at least about 100% of the depth of the hole. The height of the meniscus of the cured fill composition should be less than about 15% of the depth of the hole, and preferably less than about 10% of the hole depth. Although a meniscus is conventionally deemed to be a concave surface or "valley" which forms on the top surface of a flowable substance in a container (i.e., the via or contact hole), as used herein the term meniscus is also intended to include convex surfaces or "hills" formed on the top surface of a substance in a container or hole. The meniscus height as used herein refers to the distance from the highest point at which the composition contacts the sidewalls of the contact or via holes to the lowest point in the concave surface of the meniscus, or for a convex meniscus, the distance from the highest point at which the composition contacts the sidewalls of the contact or via holes to the highest point on the convex surface.

The thickness of the cured fill material film on the surface of the substrate adjacent the edge of the contact or via hole should be at least about 40%, preferably at least about 50%, and more preferably at least about 70% of the thickness of the film on the substrate surface a distance away from the edge of the contact or via hole approximately equal to the diameter of the hole. Finally, the percent of solids in the compositions should be formulated so that the thickness of the film formed on the substrate surface is from about 35–250 nm. Following the methods of the invention will yield precursor structures for the dual damascene process having the foregoing desirable properties.

BRIEF DESCRIPTION OF THE DRAWINGS

FIG. 4A depicts a starting substrate structure for use in a complete fill process using a fill material of the invention;

FIG. 4B depicts the structure of FIG. 4A after a photoresist has been applied to the dielectric layer, exposed, and developed, and the contact or via hole pattern has been etched;

FIG. 4C depicts the structure of FIG. 4B after a fill material according to the invention has been applied to the structure to completely fill the via or contact holes and cured;

FIG. 4D depicts the structure of FIG. 4C after a photoresist has been applied to the structure, exposed, and developed;

FIG. 4E depicts the structure of FIG. 4D after the trench patterns have been etched;

FIG. 4F depicts the structure of FIG. 4E after the photoresist and fill material have been removed from the structure;

FIG. 4G depicts the structure of FIG. 4F after the barrier layer has been removed;

FIG. 4H depicts the structure of FIG. 4G after a metal has been deposited into the contact or via holes;

FIG. 4I depicts the final damascene structure formed during the steps shown in FIGS. 4A–4H;

DETAILED DESCRIPTION OF THE PREFERRED EMBODIMENTS

1. The Problems with Prior Art Processes and Compositions

Figure 1A:
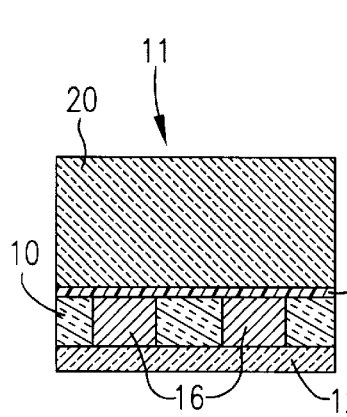
FIG. 1A depicts a starting substrate structure for use in a partial fill process using a prior art partial planarizing bottom anti-reflective coating (BARC) as the contact or via hole fill material.
Figure 1B:
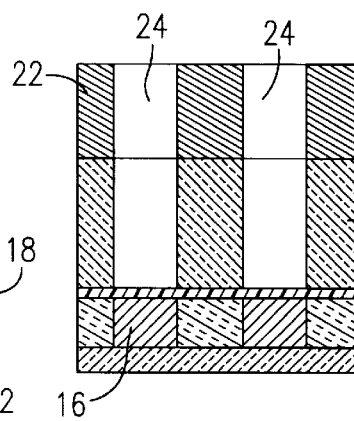
FIG. 1B depicts the structure of FIG. 1A after a photoresist has been applied to the dielectric layer, exposed, and developed, and the contact or via hole pattern has been etched.

FIGS. 1A–1I show various stages of a partial via fill process using prior art organic fill materials. In FIG. 1A a starting damascene structure 11 includes a dielectric material 10 applied to a substrate 12 and interspersed with a pattern of gate or metal conductors 16. A protective barrier layer 18 covers and thus protects dielectric material 10 and conductor 16 during further etching. A dielectric material 20 is applied immediately adjacent barrier layer 18. Referring to FIG. 1B, a photoresist 22 is then applied to the dielectric layer 20 followed by exposure and developing of the resist contact or via hole patterns onto the dielectric layer 20 and subsequent etching to form the contact or via holes 24.

Figure 1C:
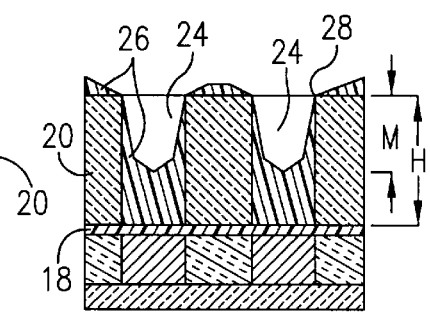
FIG. 1C depicts the structure of FIG. 1B after a prior art BARC has been applied to the structure and cured.
Figure 1D:
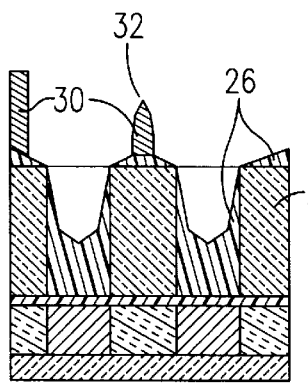
FIG. 1D depicts the structure of FIG. 1C after a photoresist has been applied to the structure, exposed, and developed.
Figure 1E:
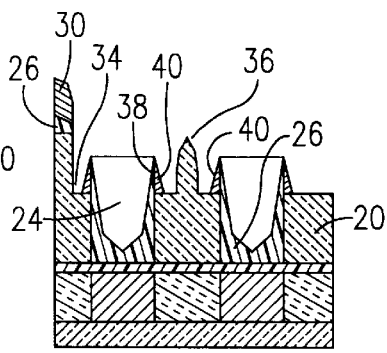
FIG. 1E depicts the structure of FIG. 1D after the trench patterns have been etched.

In FIG. 1C, a prior art BARC fill material 26 is applied to holes 24 to partially fill the holes to a level of from 35–65% of the original hole depth followed by curing of the material 26. One notable prior art shortcoming can be seen in FIG. 1C. First, at top edge 28 of the holes 24 the BARC material 26 thins and may completely dewet leaving little or no BARC material 26 to prevent reflections which will negatively impact the trench patterning step as shown in FIG. 1D where the trench patterning of a photoresist 30 is degraded at location 32. After the trench patterning, trenches 34 are etched in the dielectric material 20 and part of the dielectric material is eroded between adjacent trench lines at location 36 (see FIG. 1E) due to the degraded trench pattern. Other problems with the prior art materials is that the cured material forms a steep meniscus (the meniscus height being represented by "M" in FIG. 1C), and the etch rate of the BARC material 26 is slower than that of the dielectric layer 20. This slower etch rate combined with the steep meniscus results in the formation of peaks 38 of the BARC material 26 which allow etch polymer 40 to deposit and build up on top of the dielectric layer 20.

Figure 1F:
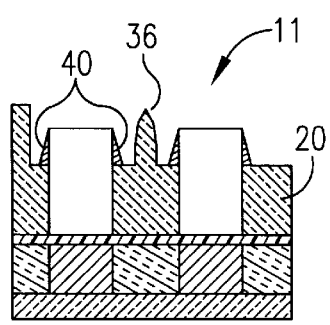
FIG. 1F depicts the structure of FIG. 1E after the photoresist and fill material have been removed from the structure.

Referring to FIG. 1F, the photoresist 30 and the BARC material 26 are then removed from structure 11. However, conventional BARC material stripping compositions will not remove the polymer 40, and the processes that do remove the polymer 40 tend to attack the dielectric layer 20 and/or protective barrier layer 18. Therefore, the polymer 40 is generally left on the structure 11 and the damascene process continued.

Figure 1G:
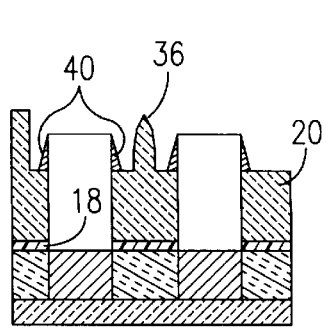
FIG. 1G depicts the structure of FIG. 1F after the barrier layer has been removed.
Figure 1H:
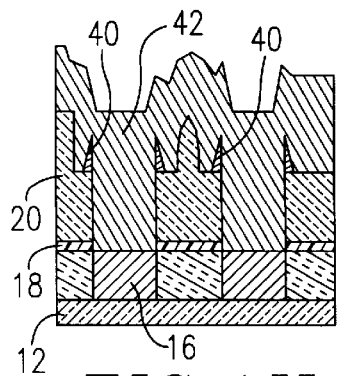
FIG. 1H depicts the structure of FIG. 1G after a metal has been deposited into the contact or via holes.

In FIG. 1G, the barrier layer 18 is removed followed by the deposition of the metal or gate material 42 in the holes 24 and trenches 34 (FIG. 1H). After the dual damascene metallization step shown in FIG. 1H, conventional CMP processes are carried out, resulting in a completed damascene structure 44.

Figure 1I:
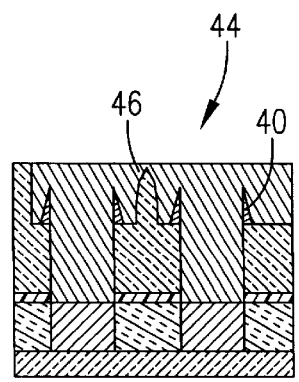
FIG. 1I depicts the final damascene structure formed during the steps shown in FIGS. 1A–1H.

Upon examining structure 44 in FIG. 1I, the problems created by the above-described prior art fill material shortcomings can be readily seen. For example, the eroded trench line locations 36 often result in a short at point 46. Also, the buildup of the etch polymer 40 (which is an insulating material) leads to higher contact/via resistivities where the metal to metal contact area between the metals in the trenches 34 and the holes 24 is reduced by the presence of the polymer 40. Furthermore, the buildup of the polymer 40 will cause increased stress in the metal around the polymer 40, thus occasionally leading to the cracking of the metal around the holes 24 and/or trenches 34 resulting in defects in the final circuit.

Figure 2A:
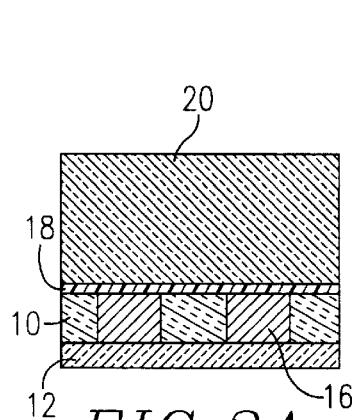
FIG. 2A depicts a starting substrate structure for use in a complete fill process using a prior art planarizing BARC as the contact or via hole fill material.
Figure 2B:
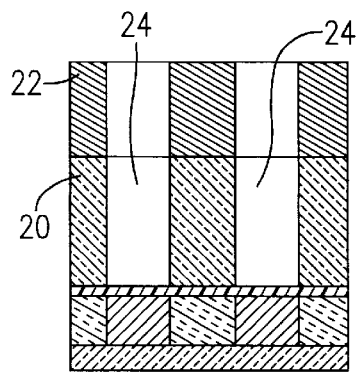
FIG. 2B depicts the structure of FIG. 2A after a photoresist has been applied to the dielectric layer, exposed, and developed, and the contact or via hole pattern has been etched.
Figure 2C:
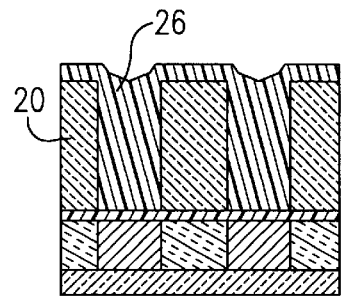
FIG. 2C depicts the structure of FIG. 2B after a prior art BARC has been applied to the structure and cured.
Figure 2D:
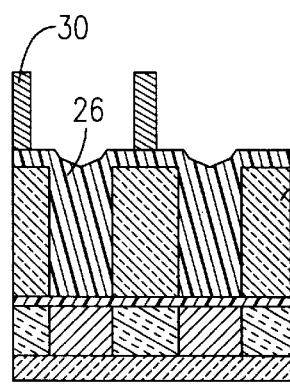
FIG. 2D depicts the structure of FIG. 2C after a photoresist has been applied to the structure, exposed, and developed.
Figure 2E:
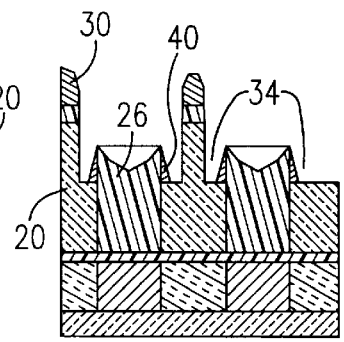
FIG. 2E depicts the structure of FIG. 2D after the trench patterns have been etched.
Figure 2F:
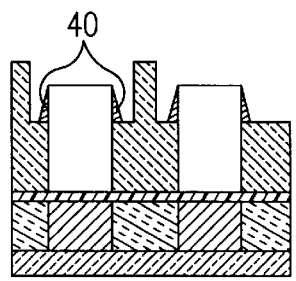
FIG. 2F depicts the structure of FIG. 2E after the photoresist and fill material have been removed from the structure.
Figure 2G:
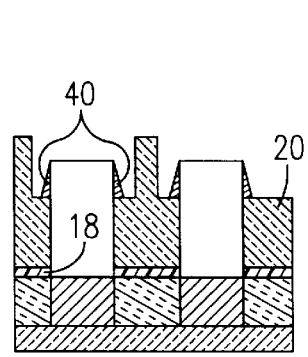
FIG. 2G depicts the structure of FIG. 2F after the barrier layer has been removed.
Figure 2H:
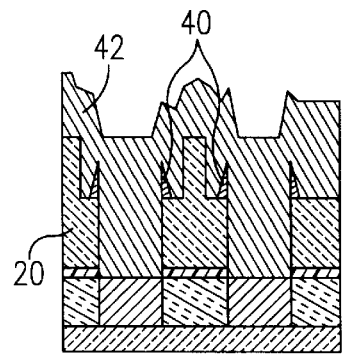
FIG. 2H depicts the structure of FIG. 2G after a metal has been deposited into the contact or via holes.
Figure 2I:
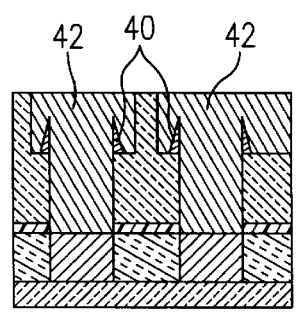
FIG. 2I depicts the final damascene structure formed during the steps shown in FIGS. 2A–2H.

FIGS. 2A–2I depict a prior art damascene process very similar to the process depicted in FIGS. 1A–1I except that FIGS. 2A–2I show the "complete" fill (i.e., greater than 95%) of the prior art BARC fill material 26 in the contact or via holes 24 as shown in FIG. 2C. The use of the complete fill process eliminates the thinning problem as discussed above with respect to the top edge 28 of the holes 24 in FIG. 1C. However, the slower etch rate of the BARC material 26 still causes the buildup of the etch polymer 40 as shown in FIGS. 2E–2I. Again, this leads to higher resistivities and metal stress around the polymer buildup.

Figure 3A:
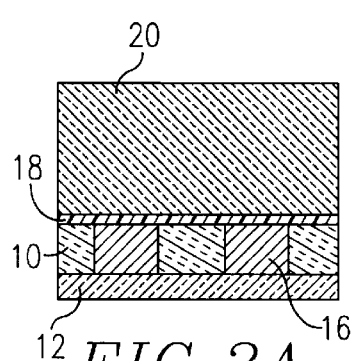
FIG. 3A depicts a starting substrate structure for use in a fill process using a prior art conformal type BARC as the contact or via hole fill material.
Figure 3B:
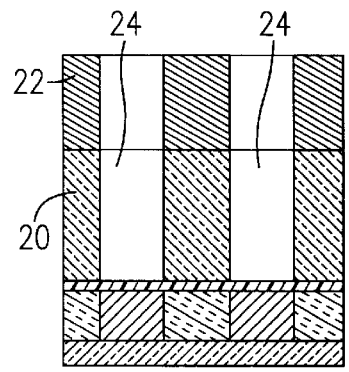
FIG. 3B depicts the structure of FIG. 3A after a photoresist has been applied to the dielectric layer, exposed, and developed, and the contact or via hole pattern has been etched.
Figure 3C:
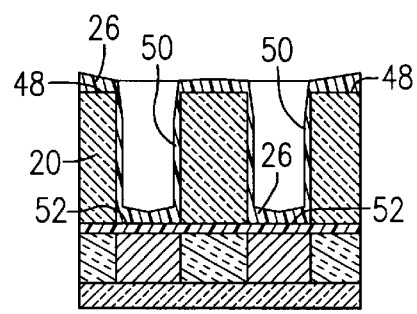
FIG. 3C depicts the structure of FIG. 3B after a prior art conformal BARC has been applied to the structure and cured.
Figure 3D:
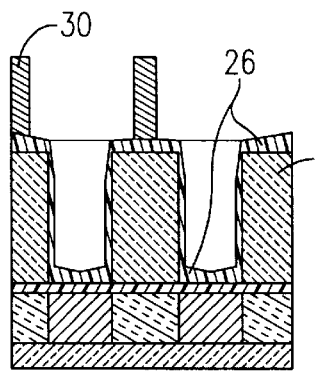
FIG. 3D depicts the structure of FIG. 3C after a photoresist has been applied to the structure, exposed, and developed.

FIGS. 3A–3I illustrate a prior art process for forming damascene structures which is very similar to the processes discussed above except that the prior art BARC fill material 26 is applied to the via or contact holes 24 in what is known as a "conformal" fashion. Referring to FIG. 3C, the conformal application is illustrated wherein a thin film of the BARC material 26 is coated over top surface 48 of the dielectric layer 20, down edge surfaces 50 of the holes 24, and on bottom surfaces 52 of the holes 24. When conformally applied, the BARC material 26 maintains nearly uniform thickness, providing good reflectivity control and minimizing damage to the trench pattern integrity. However, the slower etch rate of the BARC material 26 again leads to the problem of the etch polymer 40 building up on the dielectric layer 20 as shown in FIGS. 3E–3I.

Figure 3E:
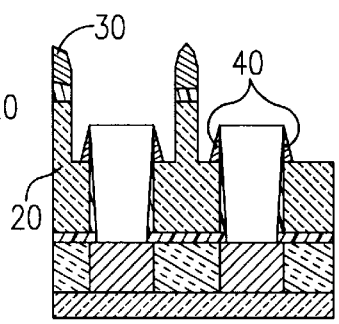
FIG. 3E depicts the structure of FIG. 3D after the trench patterns have been etched.
Figure 3F:
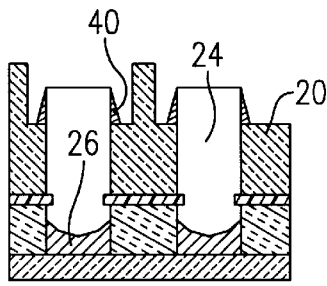
FIG. 3F depicts the structure of FIG. 3E after the photoresist and fill material have been removed from the structure.
Figure 3G:
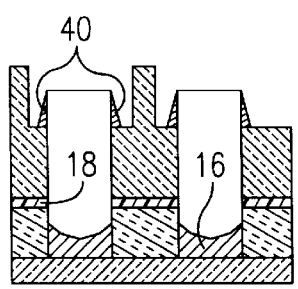
FIG. 3G depicts the structure of FIG. 3F after the remainder of the barrier layer has been removed.
Figure 3H:
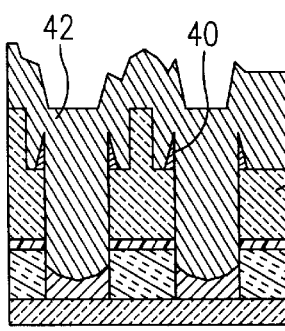
FIG. 3H depicts the structure of FIG. 3G after a metal has been deposited in the contact or via holes.
Figure 3I:
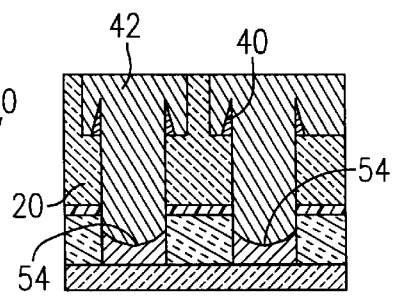
FIG. 3I depicts the final damascene structure formed during the steps shown in FIGS. 3A–3H.
Figure 5A:
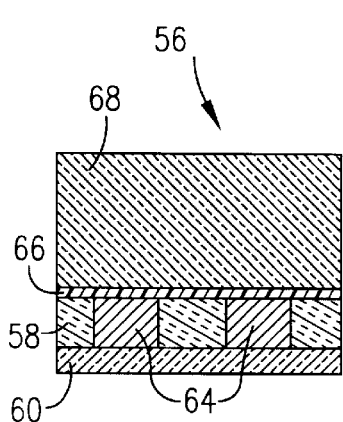
FIG. 5A depicts a starting substrate structure for use in a partial fill process using a fill material of the invention.
Figure 5B:
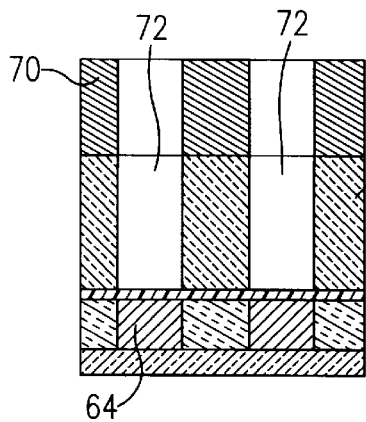
FIG. 5B depicts the structure of FIG. 5A after a photoresist has been applied to the dielectric layer, exposed, and developed, and the contact or via hole pattern has been etched.
Figure 5C:
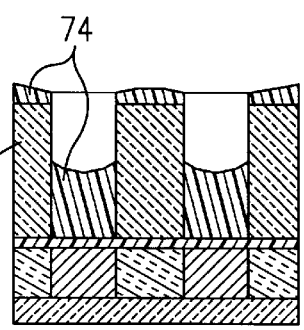
FIG. 5C depicts the structure of FIG. 5B after a fill material according to the invention has been applied to the structure to partially fill the contact or via holes and cured.
Figure 5D:
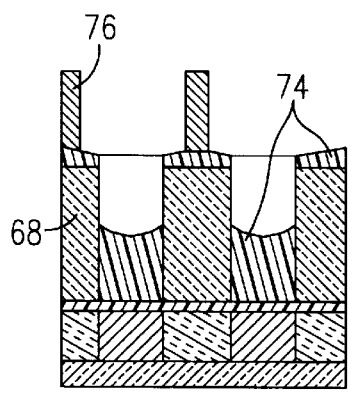
FIG. 5D depicts the structure of FIG. 5C after a photoresist has been applied to the structure, exposed, and developed.
Figure 5E:
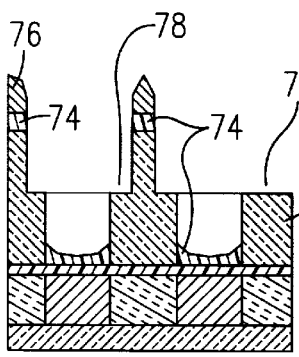
FIG. 5E depicts the structure of FIG. 5D after the trench patterns have been etched.
Figure 5F:
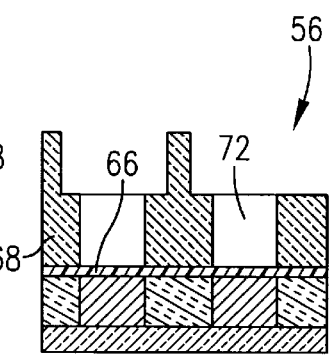
FIG. 5F depicts the structure of FIG. 5E after the photoresist and fill material have been removed from the structure.
Figure 5G:
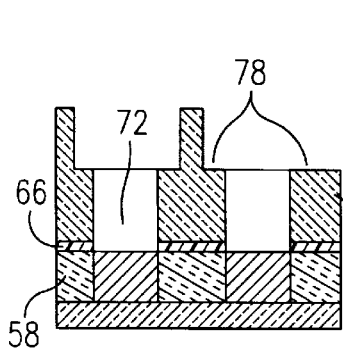
FIG. 5G depicts the structure of FIG. 5F after the barrier layer has been removed.
Figure 5H:
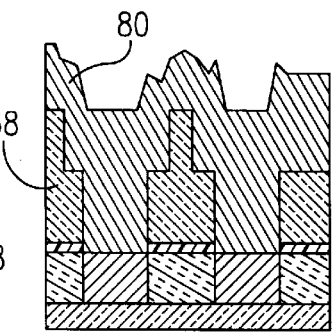
FIG. 5H depicts the structure of FIG. 5G after a metal has been deposited into the contact or via holes.
Figure 5I:
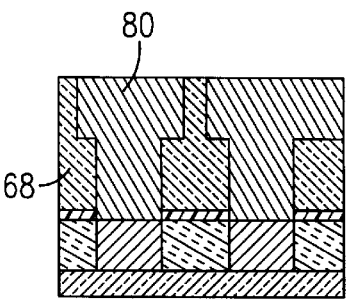
FIG. 5I depicts the final damascene structure formed during the steps shown in FIGS. 5A–5H.
Figure 6A:
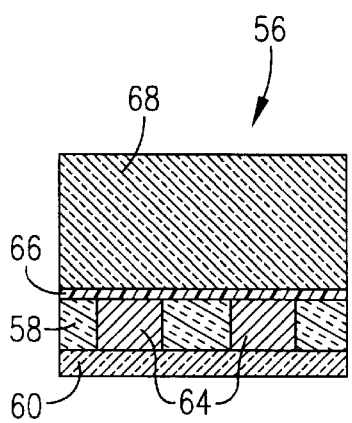
FIG. 6A depicts a starting substrate structure for use in a complete fill process using a fill material of the invention followed by applying a thin BARC over the via/contact fill material.
Figure 6B:
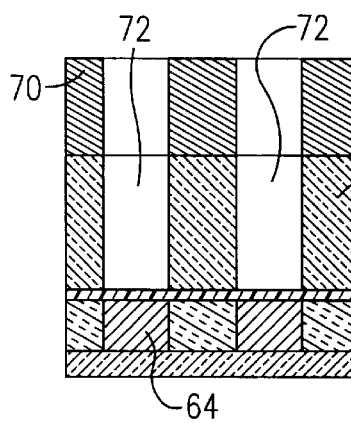
FIG. 6B depicts the structure of FIG. 6A after a photoresist has been applied to the dielectric layer, exposed, and developed, and the contact or via hole pattern has been etched.
Figure 6C:
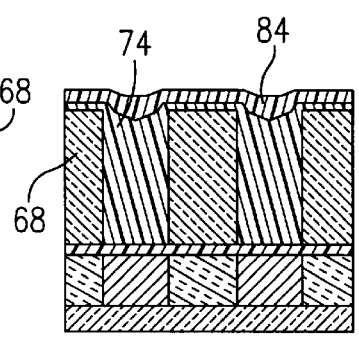
FIG. 6C depicts the structure of FIG. 6B with a fill material according to the invention applied to the structure to completely fill the contact or via holes and subsequent curing of the fill material, followed by the application of a thin film BARC to the cured fill material and subsequent curing of the thin film.
Figure 6D:
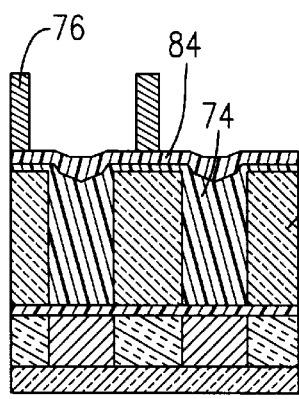
FIG. 6D depicts the structure of FIG. 6C after a photoresist has been applied to the structure, exposed, and developed.
Figure 6E:
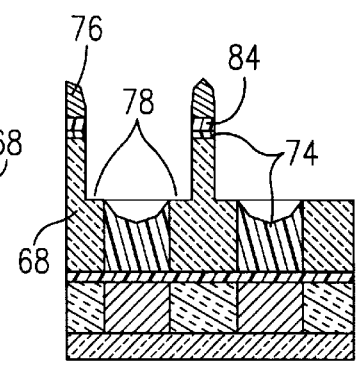
FIG. 6E depicts the structure of FIG. 6D after the trench patterns have been etched.
Figure 6F:
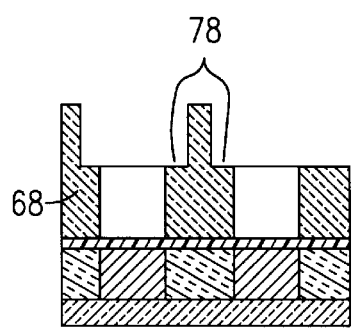
FIG. 6F depicts the structure of FIG. 6E after the photoresist, fill material, and thin film BARC have been removed from the structure.
Figure 6G:
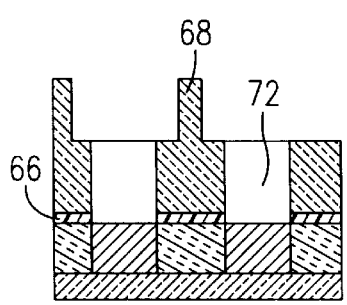
FIG. 6G depicts the structure of FIG. 6F after the barrier layer has been removed.
Figure 6H:
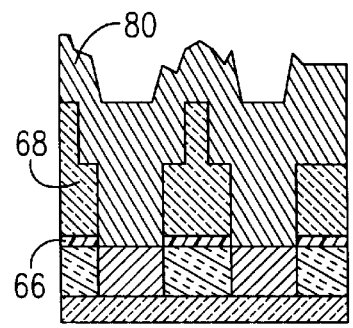
FIG. 6H depicts the structure of FIG. 6G after a metal has been deposited into the contact or via holes.
Figure 6I:
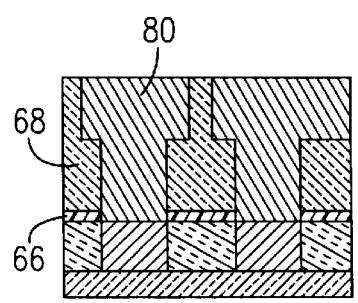
FIG. 6I depicts the final damascene structure formed during the steps shown in FIGS. 6A–6H.
Figure 7:
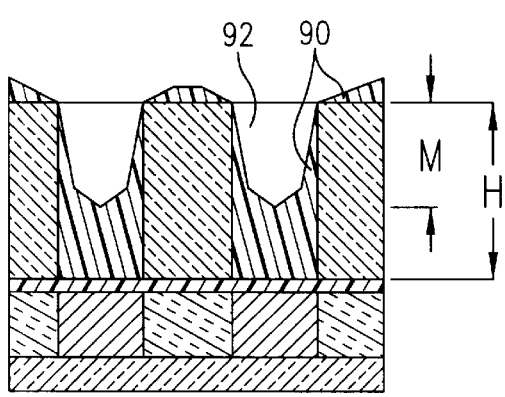
FIG. 7 depicts the meniscus height of a precursor structure in the dual damascene process utilizing a prior art fill composition in a contact or via hole.

Another problem with using prior art BARC materials in a conformal fashion is that the bottom surfaces 52 of the holes 24 often do not have sufficient protection from the etch gas during the etching process. Referring to FIG. 3E, the barrier layer 18 can be breached during etching, thus exposing the conductors 16 to attack. The etch gas utilized during the trench etching process or the resist strip removal process may also attack the conductors 16 as shown in FIG. 3F. The resist strip process generally consists of several steps including: oxygen plasma strip, ozone plasma strip, and various wet chemistries such as ozonated water, sulfuric peroxide, hydrogen peroxide, and dilute HF followed by water rinses. For most metal conductors 16, the wet chemistries will directly etch the metal and cause metal corrosion during the following rinse step, absent the protective barrier layer 18. The oxygen radical-based plasma strip process can also form stable metal oxides on the surface of the metal, thus degrading the via or contact reliability. This in turn will lead to high via or contact resistance and/or complete failure of the interconnect at point 54 (FIG. 3I) after via or contact dual damascene metallization.

2. The Present Invention

FIGS. 4A–4I, 5A–5I, and 6A–6I illustrate the improved damascene structures that can be obtained utilizing fill materials formulated according to the instant invention. FIGS. 4A–4I show a complete via fill process using organic fill materials having the properties described above. In FIG. 4A, a starting damascene structure 56 includes a dielectric material 58 applied to a substrate 60 and interspersed with a pattern of gate or metal conductors 64 (formed of aluminum, copper, tungsten, or other conducting material). The substrate 60 can be formed of silicon, GaAs, or other semiconductor materials with regions of doping to provide source and drain areas or any other electrical element. A protective barrier layer 66 covers and thus protects the dielectric material 58 and conductors 64 during further etching steps. The barrier layer 66 can be formed of silicon, tantalum, and titanium nitrides, as well as titanium and tantalum oxides. A dielectric layer 68 is applied immediately adjacent the barrier layer 66. The dielectric material 58 and the dielectric material 68 may be formed of most insulating materials, including silicon dioxide, silicon nitrides, fluorinated oxides, and titanium oxides. Referring to FIG. 4B, a photoresist 70 is applied to the dielectric layer 68 followed by exposure and developing of the contact or via hole pattern onto the dielectric layer 68 and subsequent etching to form the contact or via holes 72.

In FIG. 4C, a BARC fill material 74 formulated according to the instant invention is applied to the holes 72, preferably by the spin coat or spray coat methods, to essentially completely (i.e., at least 95% of the holes' depth) fill the holes 72. The material 74 is then cured by heating to its cross-linking temperature. During the deposition of material 74, the substrate to which the material 74 is applied may be static, or it may be spinning with a rotation of from about 200–5000 rpm. The material 74 can be applied in either a radial or reverse radial manner. Alternately, the material 74 can be applied by a spray atomization method. If necessary, in order to improve via or contact fill depth, a second or third fill composition layer can be applied after spinning the previous coat for about 15–60 seconds at a rotational speed of at least about 1500 rpm. Finally, the material 74 can also be applied utilizing the spike spin method wherein the material 74 is applied to the substrate while the substrate is accelerated to a rotational speed of about 3000–7000 rpm for about 1–3 seconds followed by deceleration to a rotational speed of from about 200–3000 rpm and spun until dry. After the application of one or more coats of the via or contact fill composition and spin drying to remove the solvent(s), the film of material 74 is ready to bake.

The initial bake step (or first stage bake) removes the volatile byproducts and solvent systems from the fill composition film and heats the film to a temperature above the reflow point of the combined solid components present in the material 74. When heated to the reflow point, the material 74 will liquify and readily flow into the via or contact holes 72 under the force of gravity, capillary forces, or surface wetting dynamic forces to provide the desired coverage and hole fill levels and to displace trapped air, solvents, and volatiles evolving from the material 74. The initial bake temperature should be less than about 200° C., preferably less than about 140° C., and more preferably less than about 120° C. The initial bake step should not result in a chemical change in the liquified fill material 74 (e.g., the material should not cross-link). The initial bake step may be carried out in any number of ways including but not limited to a contact hotplate, a proximity hotplate with a gas pillow between the substrate and hotplate surface, a proximity hotplate with proximity pins between the substrate and the hotplate surface, convection oven, infrared oven, or halogen rapid thermal processing oven. Upon being liquified during the initial bake step, the material 74 will reach the desired coverage in less than about 60 seconds, preferably less than about 15 seconds, and more preferably less than about 1 second.

Once the material 74 has flowed sufficiently to achieve the desired coverage, the material 74 is cured in a second stage bake. The second stage bake cross-links the film of the material 74 to prevent the material 74 from interfering with subsequent resist coating and processing. Once the material 74 is cured, a photoresist 76 is applied, exposed, and developed to form patterns for trenches 78 which are subsequently etched. Because the material 74 has an etch rate equal to or greater than the etch rate of the dielectric layer 68, the problem of etch polymer buildup on the layer 68 prevalent in the prior art is eliminated as can be seen in FIGS. 4E–4I.

Referring to FIG. 4F, the photoresist 76 and the BARC material 74 are removed from structure 56 without damage to the barrier layer 66. This is typically accomplished by plasma etch, ozone strip, ozonated water strip, organic solvent strip, sulfuric peroxide cleaning, hydrogen peroxide cleaning or any combinations of the foregoing strip and clean processes. In FIG. 4G, the barrier layer 66 is then removed (such as by plasma etch) followed by the deposition of a metal or gate material 80 (with appropriate barrier and seed layers, if necessary) in the holes 72 and trenches 78 (FIG. 4H). After the dual damascene metallization step shown in FIG. 4H, conventional CMP processes are carried out resulting in a completed damascene structure 82. Unlike the prior art, the resulting structure 82 is formed without any via or contact hole fill residues, sidewall polymer buildup or crowns around the top of the via or contact holes, or pattern distortions leading to shorting of adjacent trenches.

The process shown in FIGS. 5A–5I is similar to the process described above with respect to FIGS. 4A–4I except that FIGS. 5A–5I illustrate the partial fill process utilizing fill materials according to the instant invention. FIGS. 6A–6I depict an alternate embodiment wherein a thin film of a BARC 84 is spin coat-applied over the cured fill material 74, followed by curing of the BARC film. The film 84 can be tailored to the electromagnetic wavelength used for subsequent resist exposure. The second film protects the subsequent resist pattern from electromagnetic wave variations which lead to a degraded resist pattern. Alternately, a conductive film for e-beam exposure can be applied in place of the film 84 to reduce the impact of charging within the substrate which would cause degradation of the e-beam resist pattern. A resist film 76 is then applied and patterned as described previously.

Figure 8:
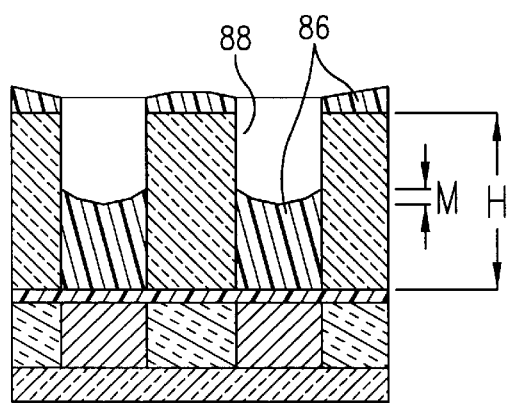
FIG. 8 depicts the meniscus height of a precursor structure in the dual damascene process utilizing a fill composition according to the instant invention in a contact or via hole.

FIGS. 7–10 compare damascene structures utilizing fill compositions according to the invention to structures utilizing prior art fill compositions. In FIG. 8, the meniscus formed by a fill composition 86 formulated according to the instant invention and applied to a via or contact hole 88 is much less steep than the meniscus formed by a prior art fill material 90 applied to a via or contact hole 92 and shown in FIG. 7. Thus, relative to the height H of the via or contact hole, the fill compositions of the instant invention have a meniscus height M of less than about 15% of H, and preferably less than about 10% of H. For example, if the height H of a via hole was 200 nm, the meniscus height M should be less than about 30 mn, and preferably less than about 20 nm. This meniscus height M in combination with the etch rate of the fill composition prevents the polymer buildup problems of the prior art, thus yielding metal conductors within the contact or via holes without increased resistance.

Figure 9:
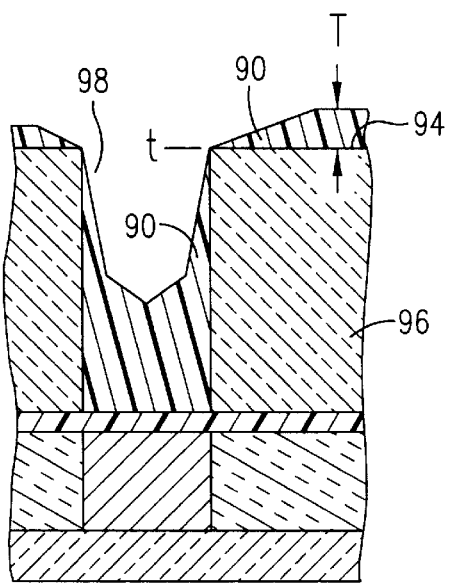
FIG. 9 depicts the thickness of a film formed from a prior art fill composition and applied to the surface surrounding a contact or via hole in a precursor structure in the dual damascene process.
Figure 10:
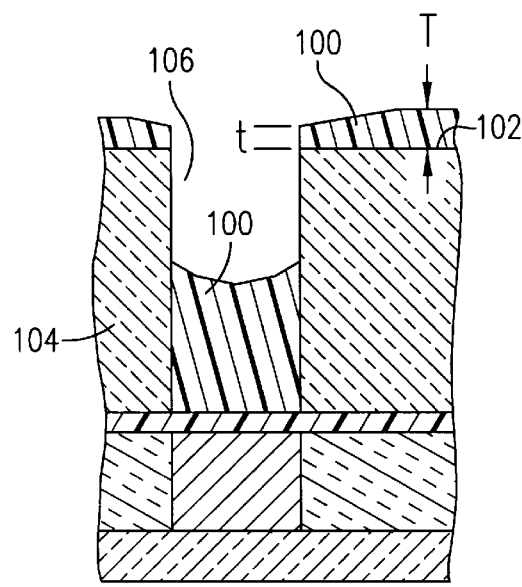
FIG. 10 depicts the thickness of a film formed from the inventive fill composition and applied to the surface surrounding a contact or via hole in a precursor structure in the dual damascene process.

FIG. 9 shows the thickness of the prior art film 90 on a surface 94 of a dielectric material 96 adjacent a via or contact hole opening 98. FIG. 10 illustrates the thickness of an inventive film 100 on a surface 102 of a dielectric material 104 adjacent a via or contact hole opening 106. In both FIGS. 9 and 10, the respective films 90, 100 have a thickness "T" at a distance from the edge of the hole approximately equal to the diameter of the hole. Each film also has a thickness "t" at areas on or closely adjacent the hole edge. The thickness t of the inventive film 100 is greater than the thickness t of the prior art prior art film 90. When using the inventive fill compositions in the dual damascene processes, t should be at least about 40% of T, preferably at least about 50% of T, and more preferably at least about 70% of T. For example, if a given hole has a diameter of 200 nm, then at about that distance from the edge of the hole, t should be at least about 0.4T.

Composition Testing

In order to determine whether a particular composition meets the requirements of the invention, the composition is subjected to the following tests:

1. Pre-Bake Thermal Stability Testing

The fill material should be reflowable and densified during the pre-bake step in order to achieve the desired fill level and fill profile. To accomplish this, the substrate and fill material must be heated to a temperature that will remove the casting solvent from the film and allow the film to flow and densify prior to cross-linking of the fill material. With the onset of cross-linking, the film viscosity and flow point increase as the film's solubility in the solvent decreases and the chemical links become rigid, thus reducing the potential density of the film.

As used herein, a "pre-bake thermal stability test" determines the degree of cross-linking during the pre-bake stage and is conducted as follows. The via fill material is spin-coated onto a flat silicon wafer followed by a 30 second pre-bake at a temperature that is either: the standard pre-bake temperature recommended by the manufacturer of the particular prior art fill material; or, above the boiling point of all solvents present in the inventive fill material. Following the pre-bake, the film thickness is measured with an ellipsometer and recorded. A solution of a casting solvent or solvents (selected for the particular fill composition being tested) is then applied to the surface of the wafer for 5 seconds followed by spin drying at 5000 rpm for 30 seconds.

Finally, the sample is baked at 100° C. for 30 seconds, and the film thickness is measured again to determine the percent of the fill material removed by the casting solvent. The percent of material removed corresponds to the quantity of noncross-linked fill composition. The inventive fill compositions are at least about 70% removed, preferably at least about 85% removed, and more preferably essentially completely removed during this test.

2. Final Bake Film Solvent Resistance Testing

In order for a fill material to perform properly as a sublayer for a photoresist layer, the cured fill material must be relatively insoluble in the solvent system from which the particular photoresist is cast. This is necessary to avoid the mixing of the fill material with the photoresist which typically degrades the performance of the photoresist. As used herein, to determine whether a particular cured fill material is insoluble in the preferred resist solvent system, a "final bake film solvent resistance test" is conducted as follows. The via fill material is spin-coated onto a flat silicon wafer followed by a pre-bake for 30 seconds at a temperature that is either: the standard pre-bake temperature recommended by the manufacturer of the particular prior art fill material; or above the boiling point of all solvents present in the inventive fill material. The sample is then subjected to a final bake for 60–90 seconds at a temperature above the material's cross-linking temperature. After the final bake, the film thickness is measured (with an ellipsometer) and recorded. PGME is applied to the surface of the wafer for 5 seconds followed by spin-drying at 5,000 rpm for 30 seconds and a 30 second bake at 100° C. The film thickness is measured again. The final film should remain intact with little loss or increase in thickness. Thus, the film thickness after the solvent contact should change less than about ±3%.

3. Film Shrinkage Testing

To obtain the desired fill material profile in a via or contact hole, the shrinkage of the fill material film between the pre-bake and final bake should be minimal. As used herein, a "film shrinkage test" is conducted as follows. The fill material is spin-coated onto a silicon wafer followed by a 30 second pre-bake at a temperature that is either: the standard pre-bake temperature recommended by the manufacturer of the particular prior art fill material; or above the boiling point of all solvents present in the inventive fill material. After the pre-bake, the film thickness is measured (with an ellipsometer) and recorded. The coated wafer is then subjected to a final bake at a temperature that is at least the cross-linking temperature of the material, after which the film thickness is determined. The percent shrinkage is calculated as follows:

% shrinkage=[(pre-bake thickness—final thickness)/pre-bake thickness]×100

The inventive fill compositions have less than about 15% shrinkage, and preferably less than about 10% shrinkage during this test.

EXAMPLES

The following examples set forth preferred methods in accordance with the invention. It is to be understood, however, that these examples are provided by way of illustration and nothing therein should be taken as a limitation upon the overall scope of the invention.

Example 1

1. Copolymer Syntheses

Using a mantle for heating, the instant reaction was carried out in a three liter, 4-necked flask equipped with a mechanical stirring rod, thermometer, nitrogen inlet plus thermocouple, and a condenser having a nitrogen outlet. Under ambient conditions, the following compounds were charged: 13.59 g of glycidyl methacrylate; 25.25 g of hydroxyl propyl methacrylate; 1.17 g of 2,2'-azobisisobutyronitrile; and 1.17 g of 1-dodecanethiol in 158.83 g of PGME. The resulting solution was stirred under nitrogen for 15 minutes to remove oxygen, followed by stirring under nitrogen for 24 hours at 70° C. The heat and nitrogen were turned off, and the reaction mixture was allowed to cool to room temperature.

2. Mother Liquor Syntheses

Using a mantle for heating, the instant reaction was carried out in a three liter, 4-necked flask equipped with a mechanical stirring rod, thermometer, nitrogen inlet plus thermocouple, and a condenser having a nitrogen outlet. Under ambient conditions, the following compounds were charged: 65 g of the copolymer prepared in Part 1 of this example (20 weight % in PGME); 6.85 g of 9-anthracenecarboxylic acid; 0.173 g of benzyltriethylammonium chloride; and 27.75 g of PGME. The reaction mixture was then refluxed under nitrogen for 24 hours, after which the heat was turned off and the nitrogen disconnected, allowing the mixture to cool to room temperature.

Example 2

Preparation of Full Fill Via or Contact Fill Material

A via or contact fill material was prepared by mixing 27.62% by weight of the mother liquor prepared in Part 2 of Example 1 with 1.73% by weight Cymel 303LF (cross-linking material available from Cytech Industries, Inc.), 27.35% of PGMEA, and 43.3% by weight of PGME. The mixture was stirred for about 1 hour to give a clear solution after which it was exchanged for 15 hours with 7.24% (based on the weight of the mixture) of 650C exchange resin. The resulting mixture was then filtered through 2×0.1 $\mu$m (absolute) end-point filters. This material was coated onto two silicon wafers at a spin speed of 2500 rpm for 60 seconds followed by baking at 160° C. for 1 minute and then a 215° C. bake for 90 seconds. The resulting film had a thickness of approximately 1560 Å.

This composition was then applied by spin coating to two silicon wafers. The via fill material was static applied then ramped with an acceleration of 20,000 rpm/second to 2500 rpm and held for 60 seconds. The wafers were pre-baked at 160° C. for 60 seconds in contact hotplate mode. Wafer 1 had a film thickness of 1701 Å and wafer 2 had a film thickness of 1702 Å.

The pre-bake thermal stability test set forth in the testing section above was conducted on wafer 1. The film thickness after stripping was 0 Å. Thus, the film remained completely soluble at the pre-bake stage, indicating that essentially no cross-linking had occurred. Wafer 2 was then baked at 215° C. for 90 seconds in contact hotplate mode. The resulting film thickness was 1561 Å, a decrease of 141 Å (a shrinkage of 8.3%). Finally, wafer 2 was subjected to the final bake film solvent resistance test described previously. The post-strip thickness was 1,563 Å, an increase of 2 Å or 0.13%. Thus, this composition met the minimum film requirements of the fill composition of the invention.

Example 3

Preparation of Partial Fill Via or Contact Fill Material

The material prepared above in Example 2 was diluted with PGME and PGMEA to produce a via or contact fill material which would provide a film of about 550–600 Å. This fill material was applied to two silicon wafers at a spin speed of 2500 rpm for 60 seconds, followed by a 160° C. bake for 1 minute and a 215° C. bake for 60 seconds to form a film having a thickness of about 590 Å, confirming that the material was properly diluted.

The diluted fill material was then spin-coated onto two silicon wafers with static application followed by an acceleration of 20,000 rpm/second to 2500 rpm which was held for 60 seconds. Both wafers were pre-baked at 160° C. for 60 seconds in contact hotplate mode. The thicknesses of the films on wafers 1 and 2 were 639 Å and 644 Å, respectively. The pre-bake thermal stability test was conducted on wafer 1. The film thickness after stripping was 0 Å. The film remained completely soluble after the prebake, indicating that essentially no cross-linking had occurred. Wafer 2 was then baked at 215° C. for 60 seconds in contact hotplate mode. The resulting film thickness was 593 Å, a decrease of 51 Å which corresponds to a 7.9% film shrinkage. Finally, wafer 2 was subjected to the final bake film solvent resistance test, resulting in a post-strip thickness of 587 Å, a loss of 6 Å (or 1%) after the final bake. Thus, the fill material met the minimum requirements.

Example 4

Full Fill Via or Contact Fill Applications

Figure 11:
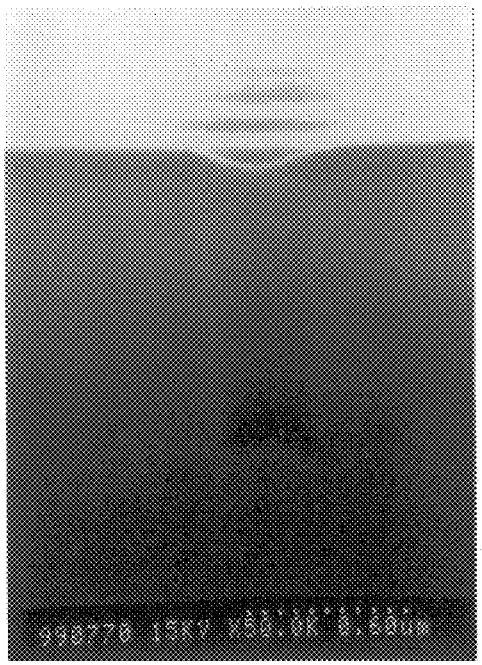
FIG. 11 is an SEM photograph (50,000×) showing a fill material of the invention applied to a via hole and cured.

The composition prepared in Example 2 was coated over an oxide film with 1 $\mu$m deep, 0.35 $\mu$m diameter holes patterned on a silicon wafer. The composition was coated by dynamic dispensing on the substrate at a 400 rpm spin speed held for 5 seconds, followed by a 20,000 rpm/second acceleration to the final spin speed of 1500 rpm which was held for 30 seconds. The film was then pre-baked in contact hotplate mode at 160° C. for 60 seconds followed by a contact hotplate final bake at 215° C. for 60 seconds. The wafer was then cross-sectioned for SEM analysis (50,000×) of the fill composition profile in the hole (see FIG. 11). The fill material completely filled the hole, and had a thickness of 104 nm at the top edge of the hole and 113 nm approximately 350 nm away from the edge of the hole. The meniscus height M was about 66 nm.

Thus, the fill material completely filled the hole as is required in full via or contact hole fill applications. The difference in fill levels between the edge of the hole and the center of the hole should be less than about 15% of the original hole depth. In this case the difference was less than 6.6%. The film thickness of the fill composition at the edge of the hole should be at least about 40% of the film thickness at a distance from the edge of the hole about equal to the diameter of the hole. In this example, the film thickness at the hole edge was 92% of the thickness one hole diameter of (i.e., 350 nm) away from the hole edge. Thus, this composition met the specifications.

Example 5

Figure 12:
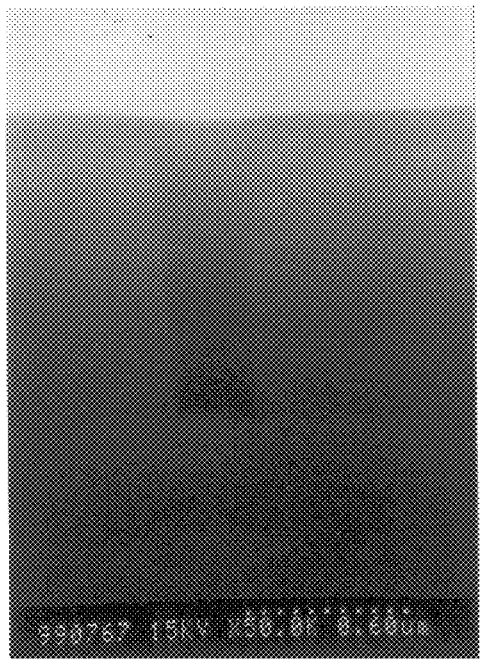
FIG. 12 is an SEM photograph (50,000×) showing a fill material of the invention applied to a via hole and cured with a thin film of anti-reflective coating applied to the top of the material followed by curing of the thin film.

Full Fill Via or Contact Fill Material with Second Layer of a Thin Anti-reflective Coating The steps of Example 4 were repeated using a thin, industry-standard anti-reflective coating (DUV30-6 ARC® which provides approximately a 600 Å thick film on flat silicon when used according to manufacturer's specifications, available from Brewer Science, Inc., Rolla, Mo.) was applied over the via fill material. The DUV30-6 was applied by dynamic dispensing on the cured via fill material at a spin speed of 400 rpm held for 5 seconds, followed by an acceleration of 20,000 rpm/second to a final spin speed of 3000 rpms which was held for 30 seconds. The film was then given a contact hotplate pre-bake at 100° C. for 30 seconds followed by a contact hotplate final bake of 175° C. for 60 seconds. The wafer was then cross-sectioned for SEM analysis (50,000×) to examine the fill composition profile in the hole (see FIG. 12). The fill material completely filled the hole as required. The thickness of the film at the top edge of the hole was 150 nm, while the thickness of the film approximately 350 nm from the edge of the hole was 150 nm. The meniscus height M was 31 nm. The difference between the fill depth at the edge of the hole and the fill depth at the center of the hole was 3.1% of the original hole depth. The thickness of the film 350 nm away from the hole was the same as the thickness at the edge of the hole, meeting all of the requirements for the film.

Example 6

Partial Fill Via or Contact Fill Applications

Figure 13:
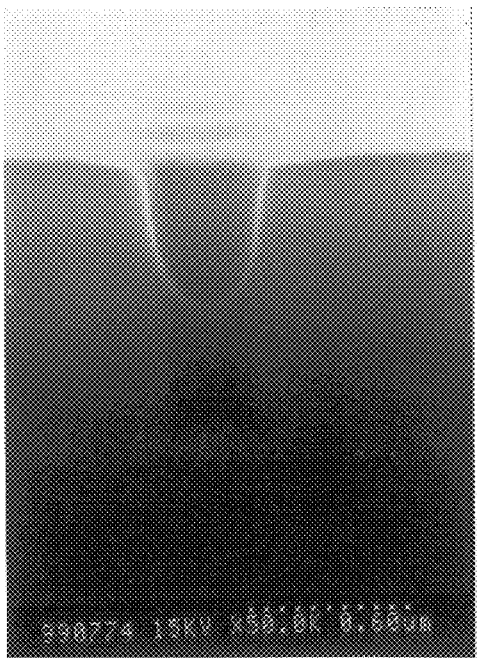
FIG. 13 is an SEM photograph (50,000×) showing a cured fill material of the invention applied to a via hole according to partial via fill processes.

The composition prepared in Example 3 was coated over an oxide film with 1 μm deep, 0.35 μm diameter holes patterned on a silicon wafer. The composition was coated by dynamic dispensing on the substrate at a 400 rpm spin speed held for 5 seconds, followed by a 20,000 rpm/second acceleration to the final spin speed of 1500 rpm which was held for 30 seconds. The film was then pre-baked in contact hotplate mode at 160° C. for 60 seconds followed by a contact hotplate final bake at 215° C. for 60 seconds. The wafer was cross-sectioned for SEM analysis (50,000×) of the fill composition profile in the hole (see FIG. 13). The fill material filled the hole to 535 nm, and had a thickness of 38 nm at the top edge of the hole and 59 nm approximately 350 nm away from the edge of the hole. The meniscus height M was about 129 nm.

In partial via or contact hole fill applications, the fill material should fill the hole to between 35% and 65% of the hole depth. In this example, the hole was filled to 53%. The difference in fill levels between the edge of the hole and the center of the hole was 12.9%. The film thickness of the fill composition at the edge of the hole was 64.4% of the thickness 350 nm away from the hole. Thus, this composition met the specifications.

Example 7

Full Fill Via or Contact Fill Applications with a Prior Art BARC

A prior art BARC (DUV30-16) was utilized to demonstrate the performance of prior art compositions. The DUV30-16 was applied to two silicon wafers by dynamic dispensing on the wafers at a spin speed of 400 rpm which was held for 5 seconds, followed by an acceleration of 20,000 rpm/second to a final spin speed of 1500 rpm which was held for 30 seconds. Both wafers were subjected to a 100° C. pre-bake in contact hotplate mode for 30 seconds. The film thicknesses on wafers 1 and 2 were 1710 Å and 1758 Å, respectively. The pre-bake thermal stability test was conducted on wafer 1, with the post-strip thickness being 1484 Å. The film was substantially insoluble after the pre-bake, indicating that significant cross-linking had occurred.

Wafer 2 was then baked at 175° C. for 60 seconds in contact hotplate mode. The resulting film thickness was 1605 Å, a decrease of 153 Å which corresponds to a film shrinkage of 8.7%. Wafer 2 was then subjected to the final bake film solvent resistance test. The post-strip thickness of wafer 2 was 1610 Å, an increase of 5 Å (or a shrinkage of −0.31%) after the final bake. Thus, the prior art BARC passed the final bake solvent resistance test and the film shrinkage test. However, the prior art BARC failed the prebake stability test in that only 13.2% of the fill composition was removed by the solvent after the pre-bake, which is substantially below the minimum requirement of at least about 70% removal.

Figure 14:
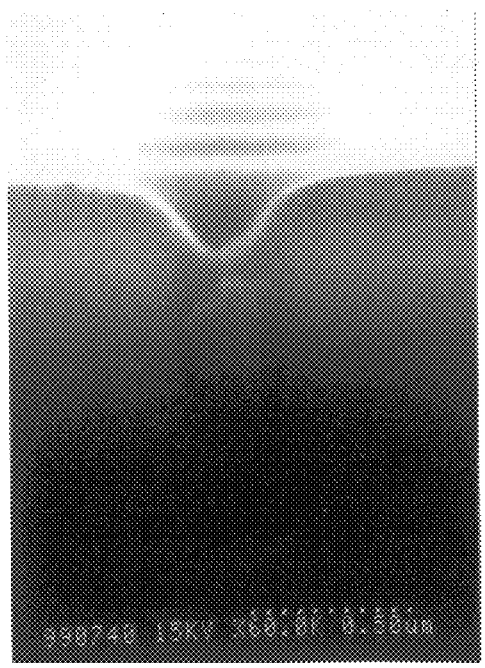
FIG. 14 is an SEM photograph (60,000×) showing a prior art BARC in a via hole after curing.

The DUV30-16 was coated over an oxide film with 1 μm deep, 0.35 μm diameter holes patterned on a silicon wafer. The composition was coated by dynamic dispensing on the substrate at a 400 rpm spin speed held for 5 seconds, followed by a 20,000 rpm/second acceleration to the final spin speed of 1500 rpm which was held for 30 seconds. The film was then pre-baked in contact hotplate mode at 100° C. for 30 seconds followed by a contact hotplate final bake at 175° C. for 60 seconds. The wafer was cross-sectioned for SEM analysis (60,000×) of the fill composition profile in the hole (see FIG. 14). The fill material did not completely fill the hole, but instead only had a fill height of 908 nm. The film thickness was 93 nm at the top edge of the hole and 157 nm approximately 350 nm away from the edge of the hole. The meniscus height M was about 220 nm.

Thus, the fill material only filled the hole to 93% of the hole depth rather than to at least about 95% as is required in full via or contact hole fill applications. Also, the difference in fill levels between the edge of the hole and the center of the hole (i.e., the meniscus height M) should be less than about 15% of the original hole depth. In this case the difference was 22%, which is greater than the allowable 15% meniscus height M. The film thickness of the fill composition at the edge of the hole should be at least about 40% of the film thickness at a distance from the edge of the hole about equal to the diameter of the hole. In this example, the film thickness at the hole edge was 59.5% of the thickness one hole diameter (i.e., 350 nm) away from the hole edge. Thus, this composition met this latter specification.

In sum, the film substantially cross-linked during the pre-bake step and did not achieve the full fill requirements for full fill application, resulting in a meniscus height M in excess of the maximum allowable height.

Example 8

Full Fill Via or Contact Fill Material Applications with a Prior Art BARC

A prior art BARC (EXP97053, available from Brewer Science, Inc.) was utilized to demonstrate the performance of prior art compositions. The EXP97053 was applied to two silicon wafers by dynamic dispensing on the wafers at a spin speed of 400 rpm which was held for 5 seconds, followed by an acceleration of 20,000 rpm/second to a final spin speed of 2500 rpm which was held for 30 seconds. Both wafers were subjected to a 100° C. pre-bake in contact hotplate mode for 30 seconds. The film thicknesses on wafers 1 and 2 were 2281 Å and 2272 Å, respectively. The pre-bake thermal stability test was conducted on wafer 1, with the post-strip thickness being 138 Å. Thus, the film remained mostly soluble after the pre-bake, indicating that a small amount of cross-linking had occurred.

Wafer 2 was then baked at 175° C. for 60 seconds in contact hotplate mode. The resulting film thickness was 1888 Å, a decrease of 384 Å which corresponds to a film shrinkage of 16.9%. Wafer 2 was then subjected to the final bake film solvent resistance test. The post-strip thickness of wafer 2 was 1877 Å, a loss of 11 Å (or a shrinkage of 0.6%) after the final bake. Thus, the prior art BARC passed the final bake solvent resistance test and the pre-bake thermal stability test. However, the prior art BARC failed the film shrinkage test in that the film thickness decreased by 16.9% during the final bake.

Figure 15:
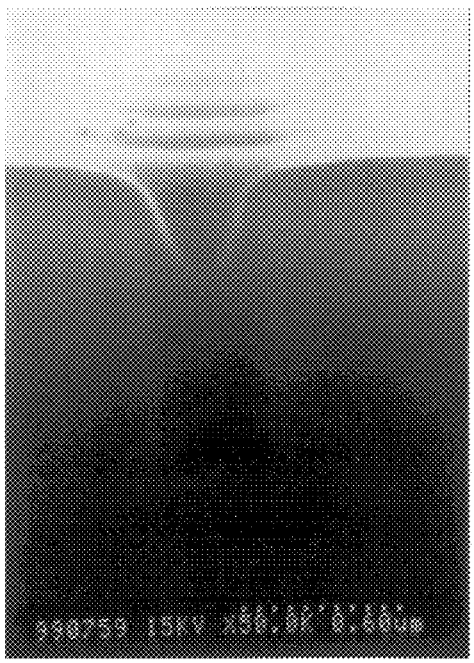
FIG. 15 is an SEM photograph (50,000×) showing a different prior art BARC material in a via hole after curing.

The EXP97053 was coated over an oxide film with 1 μm deep, 0.35 μm diameter holes patterned on a silicon wafer. The composition was coated by dynamic dispensing on the substrate at a 400 rpm spin speed held for 5 seconds, followed by a 20,000 rpm/second acceleration to a final spin speed of 2500 rpm which was held for 30 seconds. The film was then pre-baked in contact hotplate mode at 100° C. for 30 seconds followed by a contact hotplate final bake at 175° C. for 60 seconds. The wafer was cross-sectioned for SEM analysis (50,000×) of the fill composition profile in the hole (see FIG. 15). The fill material did not completely fill the hole, but instead only had a fill height of 745 nm. The film thickness was 102 nm at the top edge of the hole and 124 nm approximately 350 nm away from the edge of the hole. The meniscus height M was about 412 nm.

The fill material only filled the hole to 74.5% of the hole depth rather than to at least about 95% as is required in full via or contact hole fill applications. The difference in fill levels between the edge of the hole and the center of the hole was 41.2%, which is greater than the allowable 15% meniscus height M. The film thickness of the fill composition at the edge of the hole was 82.3% of the thickness one hole diameter of (i.e., 350 nm) away from the hole edge. Thus, this composition meets the latter specification.

In sum, the film did not achieve all of the full fill requirements for full fill applications. Rather, the film had a large amount of shrinkage between the pre-bake and final bake, leading to a large meniscus height M and an inability to fully fill the hole.

Example 9

Partial Fill Via or Contact Fill Material Applications with a Prior Art BARC

A prior art BARC (EXP97053, which was formulated to provide an approximately 800 Å thick film) was utilized to demonstrate the performance of prior art compositions. The EXP97053 was applied to two silicon wafers by dynamic dispensing on the wafers at a spin speed of 400 rpm which was held for 5 seconds, followed by an acceleration of 20,000 rpm/second to a final spin speed of 2500 rpm which was held for 60 seconds. Both wafers were subjected to a 100° C. pre-bake in contact hotplate mode for 30 seconds. The film thicknesses on wafers 1 and 2 were 799 Å and 805 Å, respectively. The pre-bake thermal stability test was conducted on wafer 1, with the post-strip thickness being 345 Å. The film remained partially soluble after the pre-bake, indicating that some cross-linking had occurred with a stripping of 56.8%.

Wafer 2 was then baked at 175° C. for 60 seconds in contact hotplate mode. The resulting film thickness was 662 Å, a decrease of 143 Å which corresponds to a film shrinkage of 17.8%. Wafer 2 was subjected to the final bake film solvent resistance test. The post-strip thickness of wafer 2 was 657 Å, a loss of 5 Å (or a shrinkage of 0.7%) after the final bake. Thus, the prior art BARC passed the final bake solvent resistance test. However, the prior art BARC failed the film shrinkage test in that the film thickness decreased by 17.8% during the final bake. The prior art BARC also failed the pre-bake thermal stability test in that only 56.8% of the fill composition was removed.

Figure 16:
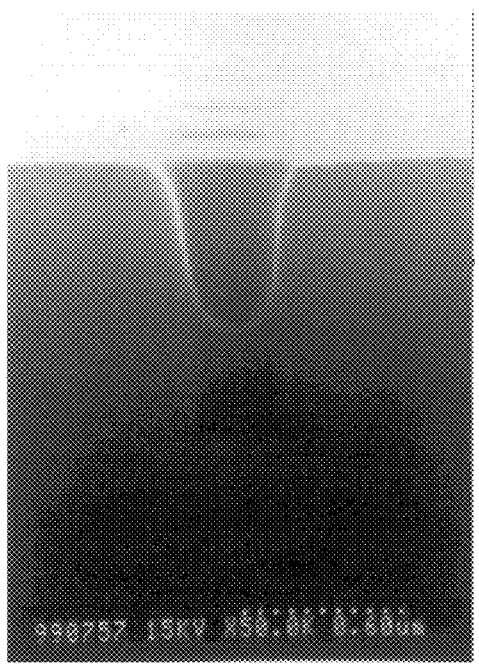
FIG. 16 is an SEM photograph (50,000×) showing a prior art cured BARC partially filling a via hole.

The EXP97053 was coated over an oxide film with 1 μm deep, 0.35 μm diameter holes patterned on a silicon wafer. The composition was coated by dynamic dispensing on the substrate at a 400 rpm spin speed held for 5 seconds, followed by a 20,000 rpm/second acceleration to the final spin speed of 2500 rpm which was held for 30 seconds. The film was then pre-baked in contact hotplate mode at 100° C. for 30 seconds followed by a contact hotplate final bake at 175° C. for 60 seconds. The wafer was then cross-sectioned for SEM analysis (50,000×) of the fill composition profile in the hole (see FIG. 16). The fill material filled the hole to 426 nm, with the thickness of the film being 14 nm at the top edge of the hole and 32 nm approximately 350 nm away from the edge of the hole. The meniscus height M was about 257 nm.

In partial fill applications, the material should fill the hole to between 35% and 65%. In this example, the material filled the hole to 42.6%. The difference in fill levels between the edge of the hole and the center of the hole was 25.7%, which is greater than the allowable 15% meniscus height M. The film thickness of the fill composition at the edge of the hole was 43.8% of the thickness one hole diameter of (i.e., 350 nm) away from the hole edge, just meeting this requirement.

In sum, this composition had significant cross-linking and a large amount of shrinkage between pre-bake and final bake (leading to a large meniscus) and did not meet the minimum requirements.

We claim:

1. A precursor structure formed during the course of the dual damascene patterning process, comprising:

a dielectric material having a hole formed therein and defined by a bottom wall and sidewalls and said hole presenting a hole depth; and a quantity of a cured, organic fill composition within the hole contacting at least a portion of the surfaces of the bottom wall and sidewalls, said composition presenting a meniscus, said meniscus height M being less than about 15% of the depth of the hole.

2. The structure of claim 1, said hole having a diameter and an upper circumferential edge defining an opening, said dielectric material presenting a surface adjacent said circumferential edge, wherein at least a portion of said fill composition is applied to said dielectric material surface in the form of a film, said film having a thickness T at a distance from said circumferential edge approximately equal to the diameter of the hole and a thickness t adjacent the edge of the hole, and wherein t is at least about 40% of T.

3. The structure of claim 1, said composition filling at least about 50% of the depth of the hole.

4. The structure of claim 3, said composition filling at least about 95% of the depth of the hole.

5. The structure of claim 2, said composition filling at least about 50% of the depth of the hole.

6. The structure of claim 5, said composition filling at least about 95% of the depth of the hole.

7. The structure of claim 1, further including an anti-reflective layer applied to at least a portion of said cured fill composition.

8. A precursor structure formed during the course of the dual damascene patterning process comprising:

a dielectric material having a hole formed therein, said hole having a diameter and being defined by a bottom wall and sidewalls, said sidewalls having an upper circumferential edge defining an opening, said dielectric material presenting a surface adjacent said circumferential edge; and a quantity of a cured, organic fill composition within the hole and in contact with at least a portion of the surfaces of the bottom wall and sidewalls and on the dielectric material surface in the form of a film, said film having a thickness T at a distance from said circumferential edge approximately equal to the diameter of the hole and a thickness t adjacent the edge of the hole, and wherein t is at least about 40% of T.

9. The structure of claim 8, said composition filling at least about 50% of the depth of the hole.

10. The structure of claim 9, said composition filling at least about 95% of the depth of the hole.

11. The structure of claim 8, further including an anti-reflective layer applied to at least a portion of said fill composition.

* * * * *